United States Patent
Huang et al.

(10) Patent No.: US 6,485,576 B1
(45) Date of Patent: Nov. 26, 2002

(54) METHOD FOR REMOVING COATING BEAD AT WAFER FLAT EDGE

(75) Inventors: Kuan-Chi Huang, Hsin-Chu (TW); Chi-Shen Lo, Hsin-Chu (TW)

(73) Assignee: Taiwan SEmiconductor Manufacturing Co., Ltd., Hsin Chu (TW)

( * ) Notice: Subject to any disclaimer, the term of this patent is extended or adjusted under 35 U.S.C. 154(b) by 617 days.

(21) Appl. No.: 08/755,117

(22) Filed: Nov. 22, 1996

(51) Int. Cl.$^7$ ............................. C23G 1/00; B08B 1/04; B08B 3/08
(52) U.S. Cl. ............... 134/2; 134/32; 134/33; 134/22.19; 134/23
(58) Field of Search ................... 134/2, 32, 33, 134/22.19, 23

(56) References Cited

U.S. PATENT DOCUMENTS 5,545,512 A * 8/1996 Nakato ..................... 430/323

FOREIGN PATENT DOCUMENTS

EP 0 394 354 * 10/1990 ............ G03C/1/76

OTHER PUBLICATIONS

Webster's II New Riverside University Dictionary, Riverside Publishing Company, Boston, pp. 635, 78, 1297, 1120, 1994.*

* cited by examiner

*Primary Examiner*—Brenda Brumback
(74) *Attorney, Agent, or Firm*—Tung & Associates

(57) ABSTRACT

The present invention provides a method for removing a coating layer of SOG or photoresist from a wafer flat side on a wafer by first injecting a flow of a cleaning solution at the bottom surface of the wafer at a location adjacent to the edge of the wafer, and then rotating the wafer at a rotational speed sufficiently high so as to cause the cleaning solution being pulled from the bottom side to the top side of the wafer by flowing around the edge to remove the coating layer covering the unintended area on the top surface of the wafer.

16 Claims, 1 Drawing Sheet

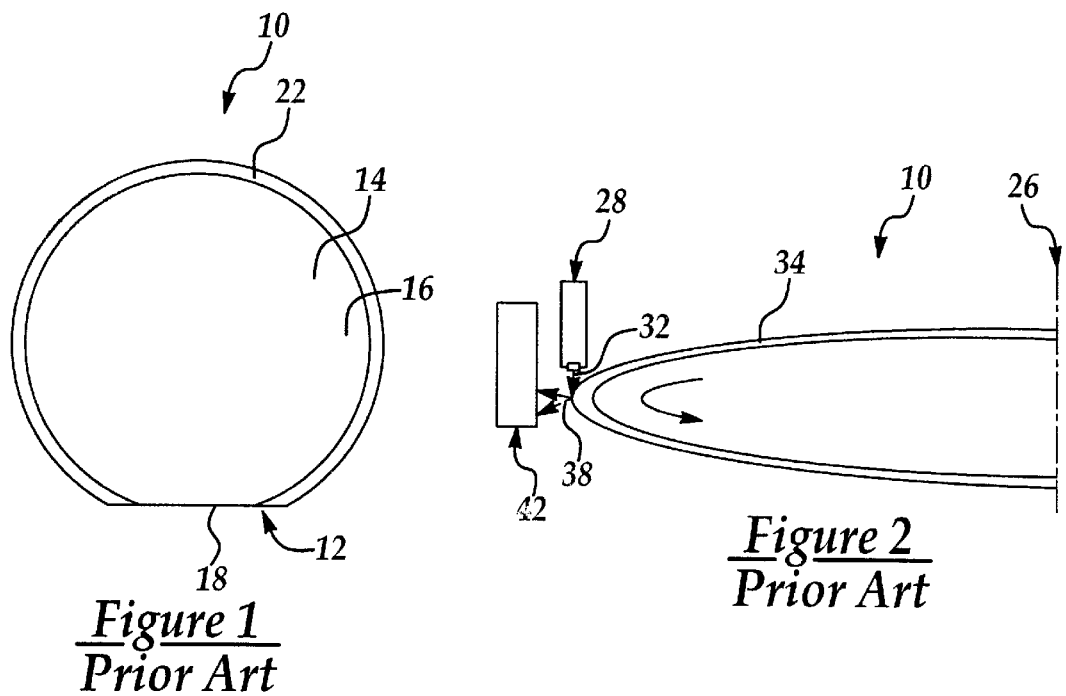
*Figure 1 Prior Art*
*Figure 2 Prior Art*
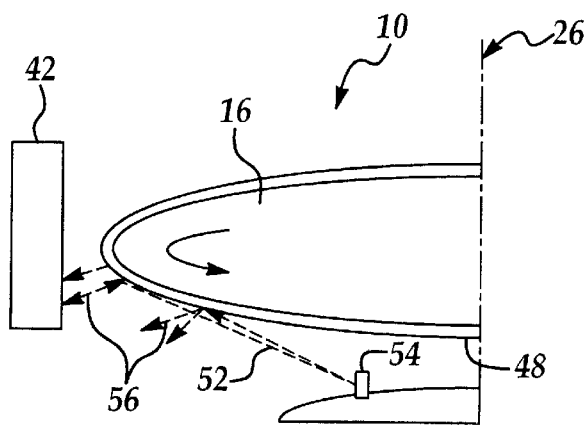
*Figure 3 Prior Art*
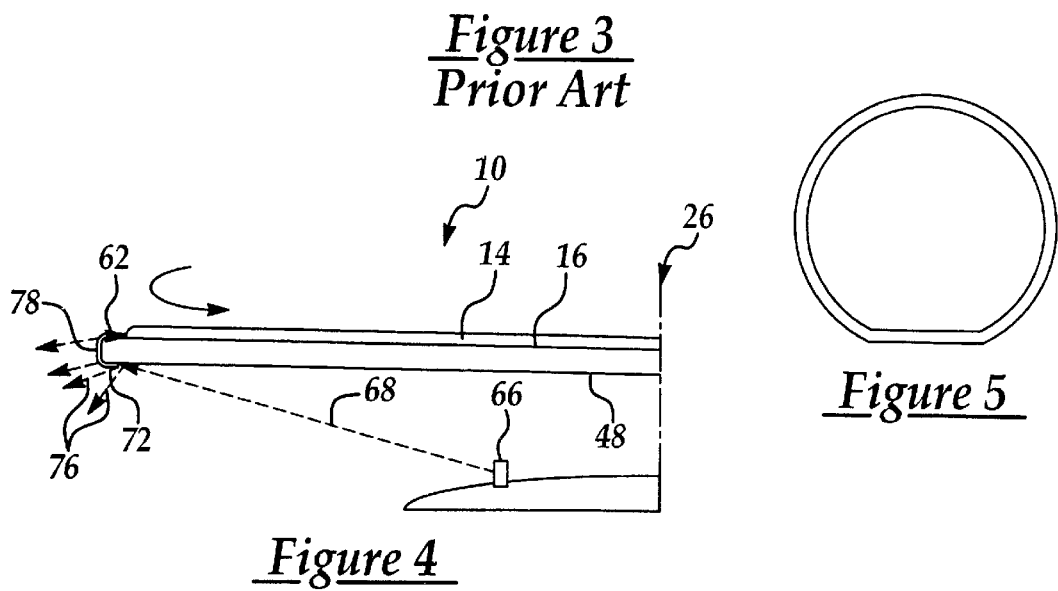
*Figure 4*
*Figure 5*

METHOD FOR REMOVING COATING BEAD AT WAFER FLAT EDGE

FIELD OF THE INVENTION

The present invention generally relates to a method for removing unwanted coating material from a semiconductor wafer and more particularly, relates to a method for removing a bead of a coating material of spin-on-glass or photoresist from a wafer flat side by a cleaning solution.

BACKGROUND OF THE INVENTION

Spin-on-glass (SOG) is frequently used for gap fill and planarization of inter-level dielectrics (ILD) in multi-level metalization structures. It is a very suitable material for use in low-cost fabrication of IC circuits. The most commonly used SOG materials are of two basic types; an inorganic type of silicate based SOG and an organic type of siloxane based SOG. The most commonly used SOG materials are silicon oxide based polysiloxanes. These polysiloxanes are featured with radical groups replacing or attaching to oxygen atoms. Based on these two basic structures, the molecular weight the viscosity and the desirable film properties of SOG can be modified and adjusted to suit the requirement of each specific IC fabrication process.

SOG film is typically applied to a pre-deposited oxide surface as a liquid to fill gaps and steps on the substrate. Similar to the application method for photoresist films, a SOG material can be dispensed onto a wafer and spun with a rotational speed which determines the SOG thickness desired. After the film is evenly applied to the surface of the substrate, it is cured at a temperature of approximately 400° C. and then etched back to obtain a smooth surface in preparation for a capping oxide layer on which a second interlevel metal may be patterned. The purpose of the etch-back step is to leave SOG between metal lines but not on top of the metal, while the capping oxide layer is used to seal and protect SOG during further fabrication processes. The siloxane based SOG material is capable of filling 0.15 micron gaps and therefore it can be used in 0.25 micron technology.

When fully cured, silicate SOG has similar properties like those of silicon dioxide. Silicate SOG does not absorb water in significant quantity and is thermally stable. However, one disadvantage of silicate SOG is the large volume shrinkage during curing. As a result, the silicate SOG retains high stress and cracks easily during curing and future handling. The cracking of the SOG layer can cause a serious contamination problem for the fabrication process. The problem can sometimes be avoided by the application of only a thin layer, i.e., 1000~2000 Å of the silicate SOG material. To build up thicker layers for filling gaps, multiple application and curing are required.

In the current SOG coating process, a solvent edge rinse and a solvent backside rinse process are utilized to remove SOG deposited on the wafer edge and on the backside of the wafer. This is shown in FIGS. 1~3. A semiconductor wafer 10 that has a flat side 12 is shown in FIG. 1. After a SOG coating process, a SOG layer 14 is blanket deposited on the top surface 16 of the wafer. The SOG layer is deposited as a dielectric layer for insulating between metal lines. In order to process the wafer in subsequent fabrication steps, the wafer must be positioned in various reaction chambers for various processes such as etching or deposition. In most of the process chambers, the wafer is positioned on a platform and held down on the edge by a wafer clamp. The function of the wafer clamp is to prevent the wafer from moving during the process where reactant gases or etching gases may be flowing through the reaction chamber. To enable the wafer clamp to function properly, the edge portion of the wafer of approximately 2~4 mm wide must be cleaned and any coating layer removed. The edge area 22 is shown in FIG. 1 on wafer 10.

In present wafer fabrication technology, the SOG layer deposited at unintended areas of the wafer can be removed in two different processes. The first process is a solvent edge rinse which is shown in FIG. 2. In this process, wafer 10 is placed on a platform (not shown) and spun at a predetermined rotational speed along a spin axis 26. The rotational speed of the wafer can be suitably adjusted for each specific application depending on the thickness of the layer to be removed and the type of chemical solution used. As shown in FIG. 2, a chemical solution injector 28 is used to inject chemical solution 32 onto the top edge 34 of the wafer. The chemical solution 38 reflected from the edge 34 of the wafer hits the chamber wall 42 and drain to the bottom of the process chamber. The solvent edge rinse process is effective in removing a limited area, i.e., a width of 2~4 mm, on the top edge of the wafer of unwanted coating materials such as SOG or photoresist. However, as shown in FIG. 1, when wafer 10 is spun around its center as a rotational axis, the flat side 12 of the wafer is not touched by the injected solvent 32 each time the wafer rotates. As a result, coating material 18 in the form of a bead remains on wafer 10.

The second cleaning process is a solvent backside rinse such as that shown in FIG. 3. The backside 48 of wafer 10 is cleaned in this process. A cleaning solution 52 is injected from a spray nozzle 54 onto the backside 48 of the wafer. The process is also known as a centrifugal spray cleaning process wherein a chemical solution, i.e., normally of a good solvent for the coating layer to be removed, is pressure-fed and injected directly onto a spinning wafer. The process can be effectively used to reduce the volume of fresh chemical consumed and is normally faster than an immersion process. After the injected chemical solution 52 hits the bottom surface 48 of the wafer, the chemical solution 56 reflects from the backside 48 of the wafer and drains into the bottom of the process tank (not shown). During a normal backside rinse process, the sprayed chemical solution 52 is only capable of rinsing on the backside 48 of the wafer and, none of the chemical solution 52 can reach the top surface 16. The bead 18 at the flat side 12 of the wafer is therefore not affected or cleaned in the backside rinse process.

Consequently, the SOG bead remains on the flat side of the wafer and eventually leads to SOG cracking during subsequent processes when a wafer clamp is pressed down on the SOG bead for mounting the wafer. The particles generated by the cracking of the SOG layer greatly contaminate the surface of the wafer and is detrimental to the yield and the quality of the IC produced.

It is therefore an object of the present invention to provide a method for removing a coating layer from an unintended area on a wafer that does not have the drawbacks or shortcomings of the conventional cleaning methods.

It is another object of the present invention to provide a method for removing a coating layer from wafer flat side to prevent the formation of a bead of the coating material.

It is a further object of the present invention to provide a method for removing a coating layer from an unintended area on the wafer flat side such that the wafer can be processed in subsequent processes without producing particle contaminants.

It is another further object of the present invention to provide a method for removing a spin-on-glass material from a wafer flat side such that a SOG build up at the flat side can be avoided.

It is still another object of the present invention to provide a method for removing a SOG layer from wafer flat side by utilizing existing backside rinse equipment.

It is yet another object of the present invention to provide a method for removing a SOG coating layer from wafer flat side by utilizing a predetermined rotational speed of the wafer such that a cleaning solution can be drawn from the underside of the wafer to the top side of the wafer.

It is still another further object of the present invention to provide a method for removing a coating material from wafer flat side by utilizing a combination of a desirable rotational speed and a desirable solvent mixture such that the solvent can be drawn from the bottom to the top of the wafer around the edge of the wafer.

SUMMARY OF THE INVENTION

The present invention provides a method for effectively removing a coating material such as SOG or photoresist layer from the wafer flat side such that a build up of the coating material and possible cracking in subsequent processing steps can be prevented.

In a preferred embodiment, the method for removing a coating material from an unintended area on a wafer can be carried out by the steps of first providing a wafer that has a top surface and a bottom surface, the top surface has a coating layer covering an unintended area along the edge of the wafer, spinning the wafer at a predetermined rotational speed, and injecting a flow of a cleaning solution at the bottom surface of the wafer adjacent to the edge of the wafer, whereby the predetermined rotational speed of the wafer pulls the cleaning solution from the bottom surface of the wafer to the top surface of the wafer to clean away the coating layer deposited at the unintended area. The flow of cleaning solution can be injected at the bottom surface of the wafer in an area immediately adjacent to the edge while the wafer is spun at a rotational speed of not less than 150 rpm. The cleaning solution utilized can be a mixture of one or more solvents selected from the group consisting of $C_5H_{10}O_3$ and $C_3H_8O$ at a suitable mixing ratio.

BRIEF DESCRIPTION OF THE DRAWINGS

These and other objects, features and advantages of the present invention will become apparent from the following detailed description and the appended drawings in which:

FIG. 1 is a top view of a conventional wafer that has a SOG bead build up at the flat side.

FIG. 2 is a perspective view illustrating a conventional method of solvent edge rinse on a wafer.

FIG. 3 is a perspective view illustrating a conventional solvent backside rinse on a wafer.

FIG. 4 is a side view illustrating the present invention method of cleaning the flat side of a coated wafer.

FIG. 5 is a top view of the present invention wafer that has a flat side after a cleaning process for the bead is conducted.

DETAILED DESCRIPTION OF THE PREFERRED EMBODIMENT

The present invention provides a novel method for cleaning a coating layer (a bead) from the wafer flat side by injecting a flow of a cleaning solution on the bottom surface of the wafer at a location immediately adjacent to the edge of the wafer and then rotating the wafer at a rotational speed sufficiently high so as to cause the cleaning solution to be pulled from the bottom surface to the top surface of the wafer by flowing around the edge to clean the coating layer covering the unintended area on the wafer flat side.

Referring now to FIG. 4, where it is shown a side view of the present invention method of cleaning the bead from a wafer flat side. Wafer 10 is positioned on a rotating table (not shown) and rotated along a center axis 26. The top surface 16 of the wafer is covered by a SOG layer 14 including the edge portion 62 of the wafer. The wafer can be mounted in a typical centrifugal spray cleaning apparatus wherein a fixed spray head 66 is used to spray a jet of cleaning solution 68 on the backside 48 of the wafer concentrating at an edge portion 72 on the bottom surface 48. While some of the cleaning solution 76 bounces off the bottom surface 48 of the wafer and drains to the bottom of the process tank (not shown), a suitable amount of cleaning solution 78 is pulled from the bottom surface 48 to the top surface 16 to clean the top edge portion 62. The process is made possible by the present invention novel method wherein the combination of a suitable rotational speed and a suitable solvent mixture are used. Under such conditions, the cleaning solution can be pulled upwards to reach the top surface of the wafer at the edge portion and thereby to clean the unwanted coating layer at the wafer flat side.

It was discovered that a suitable rotational speed for the wafer to achieve such unexpected result is between about 150 rpm and about 800 rpm.

A suitable cleaning solution used in the present invention novel method can be a mixture of $C_5H_{10}O_3$ and $C_3H_8O$. The $C_5H_{10}O_3$ cleaning solvent is commonly known as EL-100, while the $C_3H_8O$ is commonly known as IPA in the semiconductor fabrication industry. A suitable mixture of these two solvents is necessary such that a desirable viscosity or flow property of the mixture can be obtained to carry out the present invention method. A suitable mixture can be obtained by mixing between about 20 vol. % and about 80 vol. % of $C_5H_{10}O_3$ and between about 80 vol. % and about 20 vol. % of $C_3H_8O$. A suitable viscosity of the mixture can thus be obtained such that upon spraying onto a rotating surface of the wafer, the mixture travels upwardly and is pulled onto the top surface at the wafer edge to carry out the present invention novel cleaning method.

It should be noted that while EL-100 and IPA solvents are illustrated in the present invention method, the method is not limited to these two solvents. Other chemical solvents may also be suitably used as long as a desirable viscosity range and flow properties of the mixture can be achieved.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A method for removing a coating layer from an undesirable area on a wafer comprising the steps of:

providing a wafer having a top surface and a bottom surface, said top surface having a coating layer covering an undesirable area along the edge of said wafer, spinning said wafer at a predetermined rotational speed, and injecting a flow of a cleaning solution comprises $C_5H_{10}O_3$ and $C_3H_8O$ at the bottom surface of the wafer adjacent to the edge of the wafer, whereby said predetermined rotational speed of the wafer pulls said cleaning solution from the bottom surface of the wafer to the top surface of the wafer to remove the coating layer at the undesirable area.

2. A method according to claim 1, wherein said flow of cleaning solution is injected at the bottom surface of the wafer that is adjacent to the edge of the wafer.

3. A method according to claim 1, wherein said wafer is spun at a rotational speed of not less than 150 rpm.

4. A method according to claim 1, wherein said undesirable area on said wafer covered by the coating material is the wafer side.

5. A method according to claim 1, wherein said undesirable area on said wafer covered by the coating material is the edge of the wafer top side not less than 2 mm wide.

6. A method according to claim 1, wherein said coating layer to be removed is a dielectric coating layer or a photoresist coating layer.

7. A method according to claim 1, wherein said coating layer to be removed is a spin-on-glass layer.

8. A method according to claim 1, wherein said cleaning process is conducted in a centrifugal spray cleaning apparatus.

9. A method according to claim 1, wherein said cleaning solution comprises at least about 20% $C_5H_{10}O_3$ by volume.

10. A method according to claim 1, wherein said wafer is spun at a rotational speed between about 150 rpm and about 800 rpm.

11. A method for removing a coating layer from the wafer top side comprising the steps of:

providing a wafer having a top and a bottom surface, said top surface having a coating layer deposited thereon covering an undesirable area, injecting a flow of a cleaning solution comprising $C_5H_{10}O_3$ and $C_3H_8O$ on the bottom surface of the wafer at a location adjacent to the edge of the wafer, and rotating the wafer at a rotational speed that is sufficiently high to cause the cleaning solution to be pulled from the bottom to the top surface of the wafer while it is flowing around the edge thus removing the coating layer covering the undesirable area on said top surface of the wafer.

12. A method according to claim 11, wherein said coating layer to be cleaned is a dielectric coating layer or a photoresist coating layer.

13. A method according to claim 11, wherein said wafer is spun at a rotational speed of not less than 150 rpm.

14. A method for removing a coating layer of spin-on-glass from the wafer flat side comprising the steps of:

providing a wafer having a top and a bottom surface, said top surface has a spin-on-glass (SOG) layer deposited thereon covering an undesirable area, injecting a flow of a cleaning solution on the bottom surface of the wafer at a location adjacent to the edge of the wafer, said cleaning solution comprises between about 20 vol. % and about 80 vol. % of $C_5H_{10}O_3$, between about 80 vol. % and about 20 vol. % of $C_3H_8O$, and rotating the wafer at a rotational speed sufficiently high so as to cause the cleaning solution being pulled from the bottom surface to the top surface of the wafer by flowing around the wafer edge to remove the SOG layer covering the undesirable area on said top surface of the wafer.

15. A method according to claim 14, wherein said wafer being rotated is at a rotational speed of not less than 150 rpm.

16. A method according to claim 14, wherein said coating layer is a photoresist layer.

\* \* \* \* \*